United States Patent
Park et al.

(10) Patent No.: US 12,359,320 B2
(45) Date of Patent: Jul. 15, 2025

(54) COPPER CLAD LAMINATE FILM AND ELECTRONIC DEVICE INCLUDING SAME

(71) Applicant: TORAY ADVANCED MATERIALS KOREA INC., Gyeongsangbuk-do (KR)

(72) Inventors: Jong Yong Park, Gyeongsangbuk-do (KR); Ha Soo Lee, Gyeongsangbuk-do (KR); Jong Hun Cheon, Gyeongsangbuk-do (KR)

(73) Assignee: Toray Advanced Materials Korea Inc., Gyeongsangbuk-do (KR)

( * ) Notice: Subject to any disclaimer, the term of this patent is extended or adjusted under 35 U.S.C. 154(b) by 280 days.

(21) Appl. No.: 17/954,456

(22) Filed: Sep. 28, 2022

(65) Prior Publication Data
US 2023/0125635 A1    Apr. 27, 2023

(30) Foreign Application Priority Data
Oct. 26, 2021    (KR) .................. 10-2021-0144004

(51) Int. Cl.
*C23C 28/02*    (2006.01)
*B32B 7/12*    (2006.01)
(Continued)

(52) U.S. Cl.
CPC .............. *C23C 28/023* (2013.01); *B32B 7/12* (2013.01); *B32B 15/08* (2013.01); *B32B 15/20* (2013.01);
(Continued)

(58) Field of Classification Search
None
See application file for complete search history.

(56) References Cited

U.S. PATENT DOCUMENTS 5,112,462 A * 5/1992 Swisher ................. H05K 3/388
427/322
6,171,714 B1 * 1/2001 Bergkessel ............ C23C 14/562
428/626
(Continued)

FOREIGN PATENT DOCUMENTS

| | | |
|---|---|---|
| CN | 1988768 A | 6/2007 |
| CN | 110744890 A | 2/2020 |

(Continued)

OTHER PUBLICATIONS

Darwent—Dissociation constants—nbsnsrds31—1970 (Year: 1970).*
(Continued)

*Primary Examiner* — John Vincent Lawler
(74) *Attorney, Agent, or Firm* — Snell & Wilmer L.L.P.

(57) ABSTRACT

Disclosed are a copper-clad laminate film and an electronic device including the same. The copper-clad laminate film includes: a polyimide-based substrate having a fluorine layer disposed on at least one side thereof; a tie-layer disposed on the polyimide-based substrate having the fluorine layer placed thereon; and a copper layer disposed on the tie layer, wherein the tie-layer includes at least one metal element selected from among metal elements of Group 4, Group 6, Group 13, and Group 14 in the Periodic Table, and the at least one metal element may have a metal-oxygen (M-O) bond dissociation energy of 400 kJ/mol or more.

11 Claims, 2 Drawing Sheets

(51) Int. Cl.
  *B32B 15/08*   (2006.01)
  *B32B 15/20*   (2006.01)
  *C08J 5/12*    (2006.01)
  *C23C 14/02*   (2006.01)
  *C23C 14/20*   (2006.01)
  *C25D 3/38*    (2006.01)
  *C25D 5/56*    (2006.01)
  *H01Q 1/38*    (2006.01)

(52) U.S. Cl.
  CPC ............... *C08J 5/12* (2013.01); *C23C 14/025* (2013.01); *C23C 14/20* (2013.01); *C25D 3/38* (2013.01); *C25D 5/56* (2013.01); *H01Q 1/38* (2013.01); *B32B 2457/08* (2013.01); *C08J 2379/08* (2013.01)

(56) References Cited

U.S. PATENT DOCUMENTS

| | | | |
|---|---|---|---|
| 7,601,419 B2 | 10/2009 | Song et al. | |
| 2007/0141310 A1* | 6/2007 | Song | B32B 27/304 |
| | | | 428/209 |
| 2010/0021649 A1 | 1/2010 | Song et al. | |
| 2010/0221563 A1* | 9/2010 | Kohiki | C23C 28/021 |
| | | | 205/187 |
| 2017/0303405 A1 | 10/2017 | Fukuchi | |

FOREIGN PATENT DOCUMENTS

| | | | | |
|---|---|---|---|---|
| CN | 113421697 A | * | 9/2021 | ............ C23C 14/20 |
| JP | H06/143491 A | * | 5/1994 | ............ B32B 15/01 |
| JP | 2003011273 A | | 1/2003 | |
| JP | 2003127275 A | * | 5/2003 | ............ B32B 15/08 |
| JP | 6143491 B2 | | 6/2017 | |
| TW | 201032680 A | * | 9/2010 | ............ B32B 15/08 |
| WO | 2009050971 A1 | | 4/2009 | |
| WO | 2010084867 A1 | | 7/2010 | |

OTHER PUBLICATIONS

Sugimoto—JP H06-143491 A—Jap D1+KR D1—MT—conductive laminated film—1994 (Year: 1994).*
Hsiao—properties of BPDA polyimides—Euro.Poly.J.—2002 (Year: 2002).*
Okamoto—TW 201032680 A—MT—fluoro-imide-fluoro + copper w—sputter metal—2010 (Year: 2010).*
Araki—Low_Permittivity_and_Dielectric_Loss_Polyimide—IEEE ECTC—Jun. 2020 (Year: 2020).*
Shen—CN 113421697 A—MT—fluorine-polyimide blend—nickel—copper—2021 (Year: 2021).*
PTable.com—Periodic Table—Nov. 20, 2023 (Year: 2023).*
Katsuki—JP 2003-127275 A—MT—clad laminate w—various metals as tie layers—2003 (Year: 2003).*
KIPO; Notice of Non-Final Rejection dated Jul. 25, 2022 for Korean Application No. 10-2021-0144004.

* cited by examiner

COPPER CLAD LAMINATE FILM AND ELECTRONIC DEVICE INCLUDING SAME

CROSS-REFERENCE TO RELATED APPLICATION

This application is based on and claims priority under 35 U.S.C. § 119 to Korean Patent Application No. 10-2021-0144004, filed on Oct. 26, 2021, in the Korean Intellectual Property Office, the disclosure of which is incorporated by reference herein in its entirety.

BACKGROUND

1. Field

The present inventive concept relates to a copper-clad laminate film and an electronic device including the same.

2. Description of the Related Art

A copper-clad laminate film is a laminated body of a substrate and a conductive copper foil. The use of copper-clad laminate films has been increasing in line with the trend that electronic devices are getting smaller in size and lighter in weight. In recent years, advancements in 5G mobile communication devices allow signal transmission speeds in GHz bandwidths to get commercialized. With the trend for higher frequencies of signals, it is desirable to improve dielectric characteristics and reduce thermal expansion of a substrate used in printed circuits and antenna elements. At the same time, it is necessary for a copper-clad laminate film to have superior chemical resistance in acidic and/or alkaline environments without affecting its circuit pattern etching. In this context, there still is a demand for a copper-clad laminate film that has superior etching resistance and chemical resistance while having low coefficient of thermal expansion, low permittivity, low dielectric loss, and low transmission loss at high frequency, and an electronic device including such a copper-clad laminate film.

SUMMARY

One aspect provides a copper-clad laminate film that has at high frequencies, along with a low coefficient of thermal expansion, low permittivity, low dielectric loss, and low transmission loss, while having superior etching resistance and chemical resistance.

Another aspect provides an electronic device including the copper-clad laminate film.

Additional aspects will be set forth in part in the description which follows and, in part, will be apparent from the description, or may be learned by practice of the presented embodiments of the disclosure.

According to one aspect, provided is a copper-clad laminate film including:
- a polyimide-based substrate having a fluorine layer placed on at least one side thereof;
- a tie-layer disposed on the polyimide-based substrate having the fluorine layer placed thereon; and
- a copper layer disposed on the tie-layer,
- wherein the tie-layer includes at least one metal element selected from among metal elements of Group 4, Group 6, Group 13, and Group 14 in the Periodic Table, and the at least one metal element has a metal-oxygen (M-O) bond dissociation energy of 400 kJ/mol or more.

The at least one metal element may include one or more selected from among W, Ti, Sn, Cr, Al, and Mo.

The at least one metal element may further include Ni, and the content of the Ni may be 50 wt % or less.

The polyimide-based substrate on which the fluorine layer is placed may have a thickness of about 25 μm to about 100 μm.

The fluorine layer may have a thickness that is 50% or less, relative to 100% of the thickness of the polyimide-based substrate having the fluorine layer placed thereon.

The fluorine content of a surface of the polyimide-based substrate having the fluorine layer placed thereon may be about 60 atom % to about 75 atom %.

The polyimide-based substrate having the fluorine layer placed thereon may have a surface energy of about 11 dyne/cm to about 19 dyne/cm.

The polyimide-based substrate having the fluorine layer placed thereon may have a permittivity ($D_k$) of 2.8 or less and a dielectric loss ($D_f$) of 0.003 or less at 20 GHz.

The polyimide-based substrate having the fluorine layer placed thereon may have a coefficient of thermal expansion (CTE) of 25 ppm/° C. or less.

According to another aspect,
an electronic device including the above-described copper-clad laminate film is provided.

The electronic device may include an antenna element or an antenna cable.

BRIEF DESCRIPTION OF THE DRAWINGS

The above and other aspects, features, and advantages of certain embodiments of the disclosure will be more apparent from the following description taken in conjunction with the accompanying drawings, in which.

DETAILED DESCRIPTION

Figure 1:
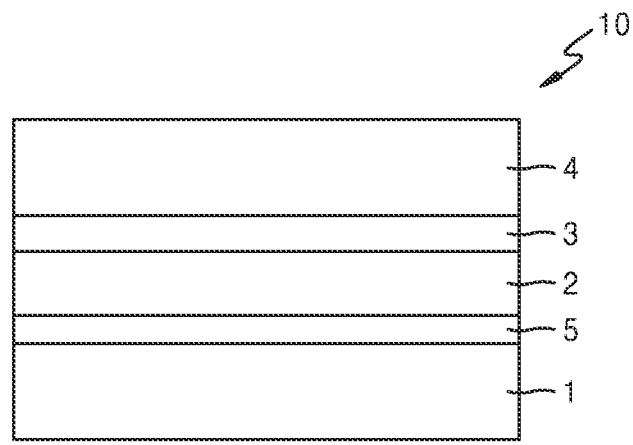
FIG. 1 is a cross-sectional schematic diagram of a copper-clad laminate film according to an embodiment.

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects of the present description. As used herein, the term "and/or" includes any and all combinations of one or more of the associated listed items. Expressions such as "at least one of," when preceding a list of elements, modify the entire list of elements and do not modify the individual elements of the list.

Hereinbelow, a copper-clad laminate film and an electronic device including the same will be described in greater detail with conjunction with examples and drawings of the present disclosure. The following examples are for illustrative purposes only to describe the present inventive concept in greater detail, and it will be apparent to those skilled in the art that these examples should not be construed as limiting the scope of the present inventive concept.

Unless otherwise defined, all technical and scientific terms used herein have the same meaning as commonly understood by one of ordinary skill in the art to which the present application belongs. In the case of any inconsistencies, the present disclosure, including any definitions therein will prevail.

Methods and materials similar or equivalent to those described herein may be used in implementation or experiments of the present disclosure, but appropriate methods and materials are described in this specification.

The terms "comprise(s)" and/or "comprising," as used herein, unless otherwise specified, does not preclude the presence or addition of one or more other elements.

As used herein, the term "and/or" includes any and all combinations of one or more of the associated listed items. The term "or" as used herein means "and/or". Expressions such as "at least one of," as used herein, when preceding a list of elements, modify the entire list of elements and do not modify the individual elements of the list.

The term "polyimide-based substrate" is used herein to include "polyimide substrate" and "polyimide-containing derivative substrate".

Throughout the specification, it is to be understood that when one component is referred to as being "on" another component, the component may be directly on the other component or intervening components may be present between the component and the other component. Meanwhile, when one element is described as being placed "directly on" another element, there may be no other elements disposed therebetween.

Among electronic devices, an antenna element is commonly manufactured by laminating onto a substrate, a metal layer e.g., a copper foil, through which electric current by wireless signals flows.

Losses associated with signal reception of antennas include a loss due to permittivity of a substrate and a signal loss from a physical cause due to electrical resistance generated when wireless signals, e.g. electrical signals, flow within a metal layer. Wireless signals having a high frequency band, compared to wireless signals having a low frequency band, tend to cause a phenomenon where an electric current generated by the wireless signals is further focused on the surface of the metal layer. In addition, a laminate-type copper-clad laminate film tends to crack on its surface due to a physical stress generated in a copper foil in curved areas of an antenna element. This may result in transmission loss. Also, a substrate having a high coefficient of thermal expansion of more than 25 ppm/° C. may cause peeling or cracking, due to a difference in coefficient of thermal expansion with respect to the conductive copper foil. In addition, in line with the trend toward smaller-sized, light-weight electronic devices, there is an increasing need to realize a micro-circuit pattern. In this context, there is a demand for a copper-clad laminate film to have excellent chemical resistance in acid and/or alkaline environments without affecting its pattern etching.

To address the above-mentioned issues, the present inventors propose a copper-clad laminate film as follows.

A copper-clad laminate film according to an embodiment may include a polyimide-based substrate having a fluorine layer placed on at least one side thereof; a tie-layer disposed on the polyimide-based substrate having the fluorine layer placed thereon; and a copper layer disposed on the tie-layer, wherein the tie-layer includes at least one metal element selected from among metal elements of Group 4, Group 6, Group 13, and Group 14 in the Periodic Table, and the at least one metal element may have a metal-oxygen (M-O) bond dissociation energy of 400 kJ/mol or more. The copper layer may consist of layers including a copper seed layer and a copper plating layer that are sequentially placed.

The copper-clad laminate film may have a low permittivity, a low dielectric loss, and a low transmission loss along with a low coefficient of thermal expansion, while having superior etching resistance and chemical resistance.

Figure 2:
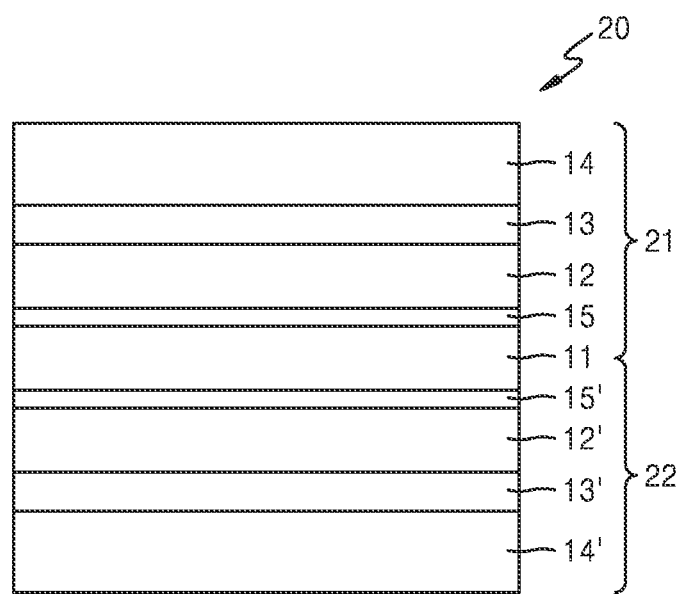
FIG. 2 is a cross-sectional schematic diagram of a double-sided copper-clad laminate film according to another embodiment.

FIG. 1 is a cross-sectional schematic diagram of a copper-clad laminate film (10) according to an embodiment. FIG. 2 is a cross-sectional schematic diagram of a double-sided copper-clad laminate film (20) according to an embodiment.

Referring to FIG. 1, the copper-clad laminate film (10) according to an embodiment may have sequentially disposed a polyimide-based substrate (1) having a fluorine layer (5) placed on one side thereof, a tie-layer (2) on the polyimide-based substrate (1) having the fluorine layer (5) placed thereon, a copper seed layer (3), and a copper plating layer (4). Referring to FIG. 2, the copper-clad laminate film (20) according to another embodiment is configured including a polyimide-based substrate (11) having a fluorine layer (15) placed on one side thereof; a first side (21) on which a tie-layer (12), a copper seed layer (13), and a copper plating layer (14) are sequentially placed on an upper surface of the polyimide-based substrate (11) having the fluorine layer (15) placed thereon; and a second side (22) on which a tie-layer (12'), a copper seed layer (13'), and a copper plating layer (14') are sequentially placed on a lower surface of the polyimide-based substrate (11) having a fluorine layer (15') placed thereon.

Hereinbelow, constituent components of the copper-clad laminate film (10, 20), namely, the polyimide-based substrate (1, 11) having the fluorine layer (5, 15, 15') placed thereon, the tie-layer (2, 12, 12'), the copper seed layer (3, 13, 13'), and the copper plating layer (4, 14, 14') will be described.

<Polyimide-Based Substrate (1, 11) with Fluorine Layer (5, 15, 15') Placed Thereon>

The polyimide-based substrate (1, 11) may be a modified PI (m-PI) substrate. The modified-PI substrate may be a resin substrate having a reduced amount of substituents with high polarity. Flowing of wireless signals through a circuit causes a change in an electric field around the circuit. Such changes in the electric field give rise to a lag in electric displacement when time is close towards the relaxation time of polarization inside a resin substrate. Here, heat is generated from friction between molecules inside the resin substrate, and this generated heat affects dielectric characteristics. Therefore, a modified-polyimide substrate having a reduced amount of substituents with high polarity may be used as the substrate.

The fluorine layer (5, 15, 15') may be placed on one side or both sides of the polyimide-based substrate (1, 11). The fluorine layer (5, 15, 15') may include one or more fluoropolymers selected from among polytetrafluoroethylene (PTFE), perfluoroalkoxy (PFA), fluorinated ethylenepropylene (FEP), chlorotrifluoroethylene (CTFE), tetrafluoroethylene/chlorotrifluoroethylene (TFE/CTFE), ethylenechlorotrifluoroethylene (ECTFE), and polyvinylidene fluoride (PVDF). For example, the fluorine layer (5, 15, 15') may be perfluoroalkoxy (PFA).

The thickness of the polyimide-based substrate (1, 11) on which the fluorine layer (5, 15, 15') are placed may be about 25 μm to about 100 μm. For example, the thickness of the polyimide-based substrate (1, 11) having the fluorine layer (5, 15, 15') placed thereon may be about 25 μm to about 90 μm, about 25 μm to about 80 μm, about 25 μm to about 70 μm, about 25 μm to about 60 μm, and about 25 μm to about 50 μm. The thickness of the fluorine layer (5, 15, 15') may be 50% or less with respect to 100% of the thickness of the polyimide-based substrate (1, 11) on which the fluorine layer (5, 15, 15') is placed. When the thickness of the polyimide-based substrate (1, 11) on which the fluorine layer (5, 15, 15') is placed, is less than 25 μm, productivity of manufacturing of the copper-clad laminate film (10, 20) may be decreased, whereas when the thickness of the polyimide-based substrate (1, 11) on which the fluorine layer (5, 15, 15') is placed exceeds 100 μm, it may be difficult to realize a thin film.

The fluorine content of the surface of the polyimide-based substrate (1, 11) having the fluorine layer (5, 15, 15') placed thereon may be about 60 atom % to about 75 atom %. Within such ranges of fluorine content, the polyimide-based substrate (1, 11) having the fluorine layer (5, 15, 15') placed thereon may achieve low permittivity, low dielectric loss, and low transmission loss. The polyimide-based substrate (1, 11) having the fluorine layer (5, 15, 15') placed thereon may have, at a frequency of 20 GHz, a permittivity ($D_k$) of 2.8 or less and a dielectric loss ($D_f$) of 0.003 or less. For example, the polyimide-based substrate (1, 11) having the fluorine layer (5, 15, 15') placed thereon may have, at a frequency of 20 GHz, a permittivity ($D_k$) of about 0.01 to about 2.8 and a dielectric loss ($D_f$) of about 0.00001 to about 0.003.

The coefficient of thermal expansion (CTE) of the polyimide-based substrate (1, 11) having the fluorine layer (5, 15, 15') placed thereon may be 25 ppm/° C. or less. For example, the coefficient of thermal expansion (CTE) of the polyimide-based substrate (1, 11) having the fluorine layer (5, 15, 15') placed thereon may be about 0.01 ppm/° C. to about 25 ppm/° C. When used to manufacture the copper-clad laminate film (10, 20) with a copper foil including the copper seed layer (3, 13, 13') and the copper plating layer (4, 14, 14'), the polyimide-based substrate (1, 11) having the fluorine layer (5, 15, 15') with such a coefficient of thermal expansion (CTE) has not big a difference in CTE with the CTE (16-20 ppm) of a copper layer consisting of the copper seed layer (3, 13, 13') and the copper plating layer (4, 14, 14'), and thus, the amount of residual stress is low that no bending, warpage due to shrinkage, and bending issues occur.

When necessary, prior to placing a tie-layer (2, 12, 12') described below, a surface treatment of the polyimide-based substrate (1, 11) having the fluorine layer (5, 15, 15') placed thereon may be performed by irradiating an ion beam, which has a reaction gas ionized, on top of the polyimide-based substrate (1, 11) having the fluorine layer (5, 15, 15') placed thereon. As a result, functional groups such as —OH, —CHO, and —COOH on the surface of the fluorine layer (5, 15, 15'), are generated, thus providing a copper clad laminate film (10, 20) that has excellent adhesion even at high temperatures.

The surface treatment using the ion beam may utilize a reaction gas including one or more selected from among nitrogen ($N_2$), oxygen ($O_2$), argon (Ar), xenon (Xe), and helium (He). In particular, the reaction gas may be composed of oxygen ($O_2$) alone or may be a mixture gas of argon-oxygen (Ar—$O_2$) or argon-nitrogen (Ar—$N_2$), and in this case, even at high temperatures, adhesion of the polyimide-based substrate (1, 11) having the fluorine layer (5, 15, 15') placed thereon, with a tie-layer (2, 12, 12') and a copper seed layer (3, 13, 13') and a copper plating layer (4, 14, 14') may drastically increase.

In addition, when using argon (Ar) in a mixture as the reaction gas, the argon (Ar) may be included in an amount of about 0.1 vol % to about 50 vol %, or about 0.1 vol % to about 30 vol %, or about 0.1 vol % to about 25 vol % with respect to the total volume of the reaction gas. Use of argon (Ar) in the mixture within such ranges may drastically improve, even at high temperatures, adhesion between the polyimide-based substrate (1, 11) having the fluorine layer (5, 15, 15') placed thereon and the tie-layer (2, 12, 12'), the copper seed layer (3, 13, 13'), and the copper plating layer (4, 14, 14') described below.

A flow rate of the reaction gas may be, for example, about 1 sccm to about 100 sccm (standard cubic centimeter per minute), about 50 sccm to about 100 sccm, or about 60 sccm to about 80 sccm. By having the flow rate in such ranges, stable irradiation of an ion beam may be achieved on a surface of the polyimide-based substrate (1, 11) having the fluorine layer (5, 15, 15') placed thereon.

An irradiation dose of the ion beam may be, without being limited to about $1 \times 10$ ions/cm$^2$ to about $1 \times 10^{17}$ ions/cm$^2$, and in this range, the effect of ion beam radiation may be maximized on the surface of the polyimide layer.

Also, the irradiation time of the ion beam is not limited and may be appropriately adjusted according to an intended purpose.

A roll-to-roll process may be employed as an irradiation method of the ion beam. For example, the roll-to-roll process may be performed by irradiating the ion beam in an MD (machine direction) direction for about 1 second to about 50 seconds, to the surface of the polyimide-based substrate (1, 11) having the fluorine layer (5, 15, 15') placed thereon that is continuously supplied at about 2 mpm to about 10 mpm (meters per minute). Within such ranges, the copper-clad laminate film (10, 20) may have superior adhesion and superior efficiency.

A power for application of the ion beam may be from about 0.1 kV to about 5 kV, about 0.1 kV to about 3 kV, or about 0.5 kV to about 2 kV. Within such ranges, adhesion of the tie-layer (2, 12, 12'), the copper seed layer (3, 13, 13'), and the copper plating layer (4, 14, 14') with the polyimide-based substrate (1, 11) having the fluorine layer (5, 15, 15') placed thereon may drastically increase even at high temperature.

<Tie-Layer (2, 12, 12')>

On the polyimide-based substrate (1, 11) having the fluorine layer (5, 15, 15') positioned thereon, the tie-layers (2, 12, 12') are positioned. The tie-layer (2, 12, 12') may include at least one metal element selected from among metal elements of Group 4, 6, 13, and 14 in the Periodic Table. The tie-layer (2, 12, 12') may include at least one metal or alloy selected from among metal elements of Group 4, 6, 13, and 14 on the Periodic Table.

The at least one metal element may have a metal-oxygen (M-O) bond dissociation energy of 400 kJ/mol or more. A metal element having the above M-O bond dissociation energy forms a relatively stable bond with oxygen. As a result, it is possible to improve adhesion by ensuring a stable metal oxide or alloy oxide on the interface of the tie-layer (2, 12, 12') and the fluorine layer (5, 15, 15'), and minimize transmission loss by applying the tie layer (2, 12, 12') having high electrical conductivity.

The metal element may include one or more selected from among W, Ti, Sn, Cr, Al, and Mo. The metal element forms a relatively stable bond with oxygen and may have a relatively smaller transmission loss compared to a Ni-only metal seed layer exhibiting strong ferromagnetic properties.

The metal element may further include Ni, and the content of Ni may be 50 wt % or less. The metal element may form an alloy with Ni and the content of Ni in this alloy may be 50 wt % or less. Here, the content of Ni exceeding 50 wt % may cause a high transmission loss.

The thickness of the tie-layer (2, 12, 12') may be about 10 nm to about 100 nm. If the thickness of the tie-layer (2, 12, 12') is less than 10 nm, the thickness may be too small to form sufficient metal oxides or alloy oxides on the interface with the polyimide-based substrate (1, 11) having the fluorine layer (5, 15, 15') placed thereon and thus, may not be able to provide sufficient adhesion. If the tie-layer (2, 12, 12') has a thickness of more than 100 nm, it may cause the tie-layer (2, 12, 12') to be unsuccessfully etched during the etching process for circuit formation and thus remain to cause circuit defects.

<Copper Seed Layer (3, 13, 13') and Copper Plating Layer (4, 14, 14')>

The copper seed layer (3, 13, 13') may be placed on the tie-layer (2, 12, 12'). The copper seed layer (3, 13, 13') may be a sputtered layer. The sputtered copper seed layer may impart a low transmission loss, while maintaining the inherent surface roughness of the polyimide-based substrate (1, 11) having the fluorine layer (5, 15, 15') placed thereon. For the sputtering method, methods such as physical vapor deposition (PVD), chemical vapor deposition (CVD), low pressure chemical vapor deposition (LPCVD), vacuum deposition may be used but are not limited thereto, and any and/or all sputtering methods available in the art may be used. For example, a PVD method may be used as the sputtering method.

The copper seed layer (3, 13, 13') may have a thickness of about 800 Å to about 4,000 Å. For example, the copper seed layer (3, 13, 13') may have a thickness of about 850 Å to about 3,500 Å, about 900 Å to about 3,000 Å, about 950 Å to about 2,500 Å, about 1,000 Å to about 2,000 Å, or about 1,000 Å to about 1,500 Å. When the copper seed layer (3, 13, 13') has a thickness in such ranges, it is possible to ensure conductivity during film formation and provide a copper clad laminate film (10, 20) that has a low transmission loss while having a low surface roughness ($R_z$).

A copper plating layer (4, 14, 14') may be positioned on the copper seed layer (3, 13, 13'). The copper plating layer (4, 14, 14') may be formed by methods, such as an electroless plating method and an electroplating method. For example, the copper plating layer (4, 14, 14') may be formed using an electroplating method.

For the method by which the copper plating layer is formed, any method available in the art may be utilized. For example, by electroplating using an electroplating solution including copper sulfate and sulfuric acid as base materials, a copper electroplating layer may be formed on one side of the copper seed layer (3, 13, 13'). In addition, the electroplating solution may further contain additives such as a brightener, a leveller, a corrective agent, an emulsifier, and the like, to improve productivity and surface uniformity.

The copper plating layer (4, 14, 14') may have a thickness of 12 μm or less. For example, the copper plating layer (4, 14, 14') may have a thickness of about 0.1 μm to about 12.0 μm, about 1.0 μm to about 12.0 μm, about 2.0 μm to about 12.0 μm, about 4.0 μm to about 12.0 μm, or about 6.0 μm to about 12.0 μm.

<Copper-Clad Laminate Film (10, 20)>

A copper clad laminate film (10, 20) includes a polyimide-based substrate (1, 11) having a fluorine layer (5, 15, 15') placed on at least one surface thereof, and a tie-layer on the polyimide-based substrate (1, 11) having the fluorine layer (5, 15, 15') placed thereon, the tie-layer including at least one metal element selected from among metal elements of Group 4, Group 6, Group 13, and Group 14 in the Periodic Table, wherein the at least one metal element has a metal-oxygen (M-O) bond dissociation energy of 400 kJ/mol or more. The copper clad laminate film (10, 20) may provide a copper clad laminate film having low coefficient of thermal expansion, low permittivity, low dielectric loss, and low transmission loss, while having superior etching resistance and chemical resistance.

<Electrical Device>

An electronic device according to another embodiment may include the copper clad laminate film (10, 20).

The electronic device may include an antenna device or an antenna cable. For example, the antenna device may be an antenna device for a mobile phone or display. In addition, the electronic device may include circuit boards such as USB, radar, IOT (Internet of Things) appliances for 5G, network servers, and the like.

Hereinbelow, the present inventive concept will be described in greater detail with reference to the examples and comparative examples. However, the following examples are provided only to illustrate the present inventive concept, and it will become apparent that these examples are not intended to limit the scope of the present inventive concept.

Example 1: Copper-Clad Laminate Film

A copper clad laminate film (20) as shown in FIG. 2 was prepared as follows.

Prepared as a substrate was a polyimide film (11) (manufactured by PI Advanced Materials, total thickness: 50 μm, and at 20 GHz, permittivity ($D_k$): 2.8, dielectric loss ($D_f$): 0.003, CTE: ≤25 ppm/° C.)) which has a fluorine coating layer (15, 15') of a thickness of about 12.5 μm placed on each side thereof. Using an ion beam source in a roll-to-roll type sputtering device, an ion beam treatment was performed on the first side (21) of the polyimide film (11) that has the fluorine coating layer (15) placed thereon. The ion beam treatment was performed while supplying the inert gas Ar at a flow rate of 30 sccm under a pressure of $10^{-6}$ Torr at an applied power of 1.0 kV. Then, on an upper surface of the ion beam-treated fluorine coating layer (15), a tie-layer (12) was formed to a thickness of about 20 nm by PVD, using molybdenum (purity: 99.995%) (Mo, Mo—O bond dissociation energy: 400 kJ/mol). Then, on an upper surface of the tie-layer (12), a copper seed layer (13) was formed to a thickness of about 100 nm by PVD using copper (purity: 99.995%). Then, following the same process as described above, a second surface (22) of the polyimide film (11) that has a fluorine coating layer (15') placed thereon was treated with an ion beam, and a tie-layer (12') and a copper seed layer (13') were formed thereon. Next, the copper plating layer having a thickness of about 12 μm was formed on each of the copper seed layer (13, 13') by copper electroplating. For an electrolytic copper plating solution used in the copper electroplating, a solution having a $Cu^{2+}$ concentration of 28 g/L and sulfuric acid of 195 g/L, and further containing 0.01 g/L of 3-N, N-dimethylaminodithiocarbamoyl-1-propane sulfonic acid as a brightener and a corrective agent (Atotech), was used. The copper electroplating was performed at 34° C. by applying a current density starting from 1.0 A/dm², gradually increasing up to 2.86 A/dm² in a step-wise manner.

Example 2: Copper-Clad Laminate Film

A copper-clad laminate film (20) was prepared following the same method as in Example 1, except that on the upper surface of the ion beam-treated fluorine coating layer (15), the tie-layer (12) was formed to a thickness of about 20 nm by physical vapor deposition (PVD) using molybdenum (Mo, Mo—O bond dissociation energy: 400 kJ/mol) and titanium (Ti, Ti—O bond dissociation energy: 670 kJ/mol) in a weight ratio of 50:50 (purity: 99.9% or higher).

Example 3: Copper-Clad Laminate Film

A copper-clad laminate film (20) was prepared following the same method as in Example 1, except that on the upper surface of the ion beam-treated fluorine coating layer (15), the tie-layer (12) was formed to a thickness of about 20 nm by physical vapor deposition (PVD) using molybdenum (Mo, Mo—O bond dissociation energy: 400 kJ/mol) and nickel (Ni, Ni—O bond dissociation energy: 360 kJ/mol) in a weight ratio of 70:30 (purity: 99.9% or higher).

Example 4: Copper-Clad Laminate Film

A copper-clad laminate film (20) was prepared following the same method as in Example 1, except that on the upper surface of the ion beam-treated fluorine coating layer (15), the tie-layer (12) was formed to a thickness of about 20 nm by physical vapor deposition (PVD) using molybdenum (Mo, Mo—O bond dissociation energy: 400 kJ/mol) and nickel (Ni, Ni—O bond dissociation energy: 360 kJ/mol) in a weight ratio of 50:50 (purity: 99.9% or higher).

Example 5: Copper-Clad Laminate Film

A copper-clad laminate film (20) was prepared following the same method as described in Example 1, except that on the upper surface of the ion beam-treated fluorine coating layer (15), the tie-layer (12) was formed by physical vapor deposition (PVD) to a thickness of about 20 nm using tungsten of 99.995% purity (W, W—O bond dissociation energy: 710 kJ/mol).

Example 6: Copper-Clad Laminate Film

A copper-clad laminate film (20) was prepared following the same method as in Example 1, except that on the upper surface of the ion beam-treated fluorine coating layer (15), the tie-layer (12) was formed to a thickness of about 20 nm by physical vapor deposition (PVD) using tungsten (W, W—O bond dissociation energy: 710 kJ/mol) and titanium (Ti, Ti—O bond dissociation energy: 670 kJ/mol) in a weight ratio of 90:10 (purity: 99.9% or higher).

Example 7: Copper-Clad Laminate Film

A copper-clad laminate film (20) was prepared following the same method as described in Example 3, except that when performing the ion beam treatment on the first side (21) of the polyimide film (11) having the fluorine coating layer (15) placed thereon by using the ion beam source in the roll-to-roll type sputtering device, the ion beam treatment was performed while supplying reaction gas 02 at a flow rate of 9 sccm under a pressure of $10^{-6}$ Torr and at an applied power of 1.0 kV.

Example 8: Copper-Clad Laminate Film

A copper-clad laminate film (20) was prepared following the same method as described in Example 3, except that when performing the ion beam treatment on the first side (21) of the polyimide film (11) having the fluorine coating layer (15) placed thereon by using the ion beam source in the roll-to-roll type sputtering device, the ion beam treatment was performed while supplying reaction gas $N_2$ at a flow rate of 9 sccm under a pressure of $10^{-6}$ Torr and at an applied power of 1.0 kV.

Comparative Example 1: Copper-Clad Laminate Film

A copper-clad laminate film (20) was prepared following the same method as described in Example 1, except that on the upper surface of the ion beam-treated fluorine coating layer (15), the tie-layer (12) was formed by physical vapor deposition (PVD) to a thickness of about 20 nm using copper of 99.995% purity (Cu, Cu—O bond dissociation energy: 280 kJ/mol).

Comparative Example 2: Copper-Clad Laminate Film

A copper-clad laminate film was prepared following the same process described in Example 3, except that a polyimide film (manufactured by PI Advanced Materials, thickness: 25 μm, and at 20 GHz, permittivity ($D_k$): 3.5, dielectric loss ($D_f$): 0.004, CTE: ≥25 ppm/° C.) without fluorine coating layers disposed thereon was used as the substrate.

Comparative Example 3: Copper-Clad Laminate Film

A copper-clad laminate film was prepared following the same process described in Example 3, except that a liquid crystal polymer (LCP) film (manufactured by Chiyoda, thickness: 50 μm, and at 20 GHz, permittivity ($D_k$): 2.7, dielectric loss ($D_f$): 0.002, CTE: ≥40 ppm/° C.) was used as the substrate.

Comparative Example 4: Copper-Clad Laminate Film

A copper-clad laminate film was prepared following the same process described in Example 3, except that the first side (21) of the polyimide film (11) with the fluorine coating layer (15) placed thereon, and the second side (22) were not ion beam-treated.

Evaluation Example 1: Evaluation of Physical Properties

The copper-clad laminate films prepared in Examples 1-8 and Comparative Examples 1-4 were evaluated for physical properties by the measurement methods below. The results thereof are shown in Table 1.
(1) Fluorine Content—XPS Analysis
X-ray photoelectron spectroscopy (XPS) analysis was conducted on surfaces of the polyimide films of Example 3, Example 7, Example 8, and Comparative Example 4 that have placed thereon a fluorine coating layer that is surface-treated, or not surface-treated with an ion beam. The XPS analysis was performed using the K-Alpha system by Thermo Fisher Scientific.
(2) Transmission Loss
10 circuit lines, each having a width of 40 μm and a length of 50 mm, with a spacing of 40 mm in a longitudinal direction were formed by etching on the copper-clad laminate films prepared in Example 3, Comparative Example 2, and Comparative Example 3. Then, each signal conductor and ground conductor of a trace on which the circuit line is formed were connected to test ports of a test instrument (Vector Network Analyzer), and signals were applied up to a frequency of 28 GHz to measure transmission loss. Here, transmission loss was evaluated as follows.

◯: Transmission loss of −0.5 dB/cm or more
Δ: Transmission loss of −0.5 dB/cm to −1.5 dB/cm
X: Transmission loss of less than −1.5 dB/cm (3) Etching Resistance A circuit pattern having a width of 3 mm was formed on one side of each of the copper-clad laminate films prepared in Example 1 to Example 6, and Comparative Example 1, evaluation was made on whether the 3 mm-width circuit pattern was peeled off by ferric chloride ($FeCl_3$) and copper chloride ($CuCl_2$) solutions that were used as etchant for entire surface-etching the other side of the copper-clad laminate film on which the circuit pattern is formed.

◯: No peeling of the circuit pattern occurred and no liquid infiltration under the circuit pattern occurred
Δ: Liquid infiltration under the circuit pattern occurred
X: Peeling of the circuit pattern occurred (4) Chemical Resistance A copper-clad laminate film including the circuit pattern used for etching resistance evaluation in (3) above was immersed in a 10% hydrochloric acid (HCl) solution for 1 minute, or in an alkaline solution of 5% or less for 1 minute. The copper-clad laminate film was evaluated for chemical resistance as follows.

◯: No peeling of the circuit pattern occurred and no liquid infiltration under the circuit pattern occurred
Δ: Liquid infiltration under the circuit pattern occurred
X: Peeling of the circuit pattern occurred coating layer placed thereon and compared to the copper-clad laminate films prepared in Examples 1 to 8, shows high permittivity, high dielectric loss, and high transmission loss. The copper-clad laminate film prepared in Comparative Example 3 included a liquid crystal polymer (LCP) substrate film and has a high coefficient of thermal expansion compared to the copper-clad laminate films prepared in Examples 1 to 8, and thus exhibited warping.

This result indicates that the copper-clad laminate films prepared in Examples 1 to 8 exhibit dielectric characteristics of an improved substrate suitable for high frequency ranges of 5G mobile communication devices and have superior etching resistance and chemical resistance, and thus may be applied in electronic devices such as miniaturized 5G mobile communication devices.

A copper-clad laminate film according to one aspect includes a polyimide-based substrate having a fluorine layer disposed on at least one side thereof, a tie-layer disposed on the polyimide-based substrate having the fluorine layer placed thereon, and a copper layer disposed on the tie-layer. The tie-layer may include at least one metal element selected from among metal elements of Group 4, Group 6, Group 13, and Group 14 in the Periodic Table, and the at least one metal element may have a metal-oxygen (M-O) bond dissociation energy of 400 kJ/mol or more. The copper clad laminate film may provide a copper clad laminate film having low coefficient of thermal expansion, low permittivity, low dielectric loss, and low transmission loss, while having superior etching resistance and chemical resistance.

TABLE 1

| | Substrate (@20 GHz) | | | | | | Chemical resistance | |
|---|---|---|---|---|---|---|---|---|
| Item | Permittivity ($D_k$) | Dielectric loss ($D_f$) | Thermal expansion coefficient (CTE, ppm/° C.) | Fluorine content (atom %) | Transmission loss | Etching resistance | Hydrochlorid acid | Alkalinity |
| Example 1 | 2.8 | 0.003 | ≤25 | — | ◯ | ◯ | ◯ | ◯ |
| Example 2 | 2.8 | 0.003 | ≤25 | — | ◯ | ◯ | ◯ | ◯ |
| Example 3 | 2.8 | 0.003 | ≤25 | 73.82 | ◯ | ◯ | ◯ | ◯ |
| Example 4 | 2.8 | 0.003 | ≤25 | — | ◯ | ◯ | ◯ | ◯ |
| Example 5 | 2.8 | 0.003 | ≤25 | — | ◯ | ◯ | ◯ | X |
| Example 6 | 2.8 | 0.003 | ≤25 | — | ◯ | ◯ | ◯ | ◯ |
| Example 7 | 2.8 | 0.003 | ≤25 | 65.13 | ◯ | — | — | — |
| Example 8 | 2.8 | 0.003 | ≤25 | 64.92 | ◯ | — | — | — |
| Comparative Example 1 | 2.8 | 0.003 | ≤25 | — | ◯ | ◯ | X | X |
| Comparative Example 2 | 3.5 | 0.004 | ≤25 | — | X | — | — | — |
| Comparative Example 3 | 2.7 | 0.002 | ≥40 | — | ◯ | — | — | — |
| Comparative Example 4 | 2.8 | 0.003 | ≤25 | 68.42 | ◯ | — | — | — |

As shown in Table 1, the copper-clad laminate films prepared in Example 1 to Example 6 were found to have low permittivity, low dielectric loss, low transmission loss, and low coefficient of thermal expansion, while also exhibiting superior etching resistance and chemical resistance.

The copper-clad laminate film prepared in Comparative Example 1 included a copper tie-layer (Cu—O bond dissociation energy: 280 kJ/mol) and exhibited peeling of the circuit pattern in acidic and alkaline environments. The copper-clad laminate film prepared in Comparative Example 2 included a polyimide substrate film with no fluorine It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope of the disclosure as defined by the following claims.

What is claimed is:

1. A copper-clad laminate film, comprising:
a polyimide-based substrate having a fluorine layer positioned on at least one side thereof;
a tie-layer positioned on the polyimide-based substrate having the fluorine layer positioned thereon; and
a copper layer positioned on the tie-layer,
wherein the fluorine layer comprises one or more fluoropolymers,
wherein the tie-layer consists of at least one metal element selected from among W, Ti, Sn, Al, and Mo, and further consists of Ni, and a content of the Ni is 50 wt % or less,
and the at least one metal element has a metal-oxygen (M-O) bond dissociation energy of 400 KJ/mol or more.

2. The copper-clad laminate film of claim 1,
wherein a thickness of the polyimide-based substrate having the fluorine layer placed thereon is about 25 µm to about 100 µm.

3. The copper-clad laminate film of claim 1,
wherein a thickness of the fluorine layer is 50% or less relative to 100% of a thickness of the polyimide-based substrate having the fluorine layer placed thereon.

4. The copper-clad laminate film of claim 1,
wherein a fluorine content of a surface of the polyimide-based substrate having the fluorine layer placed thereon is about 60 atom % to about 75 atom %.

5. The copper-clad laminate film of claim 1,
wherein the polyimide-based substrate having the fluorine layer placed thereon has a permittivity ($D_k$) of 2.8 or less and a dielectric loss ($D_f$) of 0.003 or less at a frequency of 20 GHz.

6. The copper-clad laminate film of claim 1,
wherein the polyimide-based substrate having the fluorine layer placed thereon has a coefficient of thermal expansion (CTE) of 25 ppm/° C. or less.

7. The copper-clad laminate film of claim 1,
wherein the copper layer has a thickness of 12 µm or less.

8. An electronic device comprising the copper-clad laminate film according to claim 1.

9. The electronic device of claim 8,
wherein the electronic device comprises an antenna element or an antenna cable.

10. The copper-clad laminate film of claim 1,
wherein the copper layer comprises a copper seed layer and a copper plating layer.

11. The copper-clad laminate film of claim 10,
wherein a thickness of the copper seed layer is about 800 Angstroms to 4,000 Angstroms.

* * * * *